March 31, 1964 M. E. GEDGAUDAS ET AL 3,127,285

VAPOR CONDENSATION DOPING METHOD

Filed Feb. 21, 1961

MINDAUGAS E. GEDGAUDAS
ERVIN T. KLIPPENSTEIN
INVENTORS

BY THEIR ATTORNEYS
SPENSLEY & HORN

United States Patent Office 3,127,285

Patented Mar. 31, 1964

3,127,285

VAPOR CONDENSATION DOPING METHOD

Mindaugas E. Gedgaudas, Santa Monica, and Ervin T. Klippenstein, Los Angeles, Calif., assignors to TRW Semiconductors, Inc., a corporation of Delaware Filed Feb. 21, 1961, Ser. No. 90,684
7 Claims. (Cl. 117—230)

Figure 1:
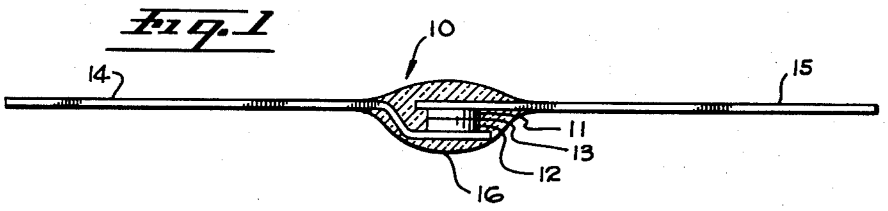

This invention pertains to semiconductor devices and more particularly to a method for providing improved broad area contact to the same.

It has long been desirable in the manufacture of many types of semiconductor devices to provide a low resistance, broad area, ohmic contact to the surface of the crystal body. To achieve this desideratum it is beneficial to dope the electrical lead or other contacting element with an impurity of the same conductivity type as the region of the semiconductor crystal body to which contact is to be made.

A lead doping method has been recently developed and involves immersion of the leads or contacting elements, in random configuration, in a water solution of the active impurity atoms. This method is fully disclosed in copending patent application S.N. 53,085, entitled "Semiconductor Contact," by the present coinventor Mindaugas E. Gedgaudas and Oliver R. Shaver, and also assigned to the present assignee. Although this method is relatively inexpensive, it results in non-uniform residue deposits commonly termed "water spots."

It is therefore an object of the present invention to provide an improved broad area, low resistance contact to the surface of a semiconductor crystal body.

Another object of the present invention is to provide an improved low resistance contact to the surface of a semiconductor crystal body of a predetermined conductivity type.

Yet another object of the present invention is to provide an improved method for producing a low resistance, broad area contact between the surface of a semiconductor crystal body and a metallic lead element.

A still further object of the present invention is to provide an improved method for depositing an active impurity upon the surface of a plated lead element for a semiconductor crystal device.

Yet a further object of the present invention is to provide a method for producing a uniformly doped gold plated lead wire to be used to make ohmic contact with the surface of a semiconductor crystal body of the same conductivity type as that of the dopant.

A still further object of the present invention is to provide an improved method for depositing a uniform layer of an active impurity upon the surface of a thin ribbon shaped metallic lead element for bonding to the surface of a miniaturized semiconductor crystal body.

It is also an object of the present invention to provide a relatively inexpensive and rapid method for depositing an active impurity upon the surface of a contacting element for a semiconductor crystal device.

It is still another object of the present invention to provide an improved method for simultaneously depositing an active impurity upon a plurality of metallic elements in random configuration.

The method of the present invention is based upon the creation of a gaseous system under a vacuum to take advantage of the sublimation or vaporization characteristics of certain active impurity substances. Although the vapor pressures of the most common active impurity substances are relatively low even at elevated temperatures, the use of an adequate vacuum enables creation of a system wherein at least 99% of the gas molecules present are molecules of the active impurity, i.e. not more than 1% of the gas molecules present in the system are of residual gases. And if the system pressure is less than about 100 microns Hg there results a sufficient improvement in system kinetics to enable the mere random motion of the gas molecules to provide a practical impurity deposition rate. Impurity deposition by mere random motion of gas molecules, as opposed to direct line of sight deposition, enables the simultaneous even coating of a plurality of randomly disposed contacting elements. The maximum useable temperature is determined by the physical composition of the metallic leads to be doped and must be less than the temperature at which the leads will melt or otherwise degrade.

Doping of metallic lead elements by the method of the present invention is accomplished by randomly disposing the lead elements and an active impurity substance within an air-tight container, evacuating the container to a predetermined pressure not in excess of 100 microns Hg, heating the active impurity substance and the lead elements within the container to a predetermined temperature at which the vapor pressure of the active impurity substance is at least about 100 times as great as the predetermined pressure to which the container has been evacuated, maintaining the predetermined temperature for a short period of time necessary to insure creation of the desired dopant-rich homogeneous atmosphere within the container, cooling to cause the deposition (or vapor condensation) of atoms of active impurity dopant upon the metallic elements, and then releasing the vacuum.

The method of the present invention is particularly suited for producing doped gold-plated leads for use in connection with micro-miniature devices which are a recent development in the semiconductor art. One such micro-miniature device is produced by the company assignee of the present invention. An example of such a device is a diffused junction silicon diode. The present invention will be described in connection with such a device. The device includes a silicon crystal body into which has been diffused a PN junction. To opposite surfaces of the crystal body there are ohmically bonded ribbon shaped lead wires to provide electrical connection to the P and N conductivity zones. The ribbon leads are of a width approximately equal to that of the crystal die and are directly bonded to substantially the entire surface thereof. The portions of the device proximate to the crystal die, in addition to being treated to produce a passive surface, are coated with a hermetically sealing, chemically inert, material. No fluxes or solders are used in providing the contact-bond between the lead ribbons and the surface of the crystal die as is often done in accordance with prior art practices. The omission of such materials minimizes the contamination of the surface, especially in the area of the PN junction, thereby materially improving the reliability of the completed device.

The novel features which are believed to be characteristic of the present invention, both as to its organization and the method of operation, together with further objects and advantages thereof, will be better understood from the following description considered in connection with the accompanying drawing in which the invention is illustrated by way of example. It is to be expressly understood, however, that the drawing is for the purpose of illustration and description only, and is not intended as a definition of the limits of the invention.

Figure 2:
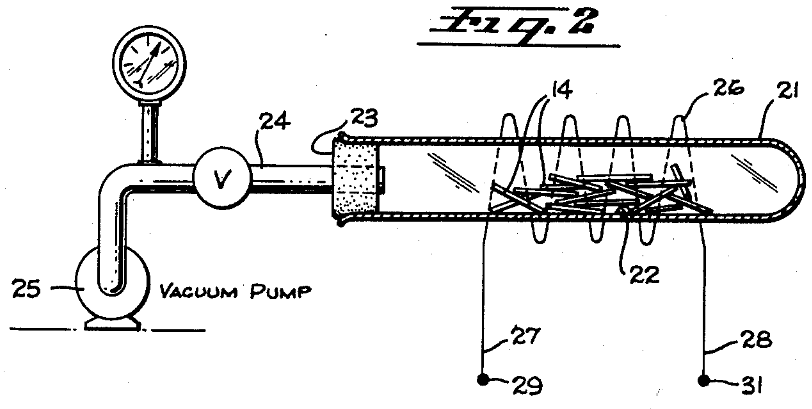

In the drawing:

FIGURE 1 is an elevational view in cross-section of a miniaturized semiconductor diode device to which has been bonded lead elements treated in accordance with the present invention; and, FIGURE 2 is an elevational view, partially in cross-section, of apparatus suitable for performance of the method of the present invention.

The invention will be described with reference to the production of a specific device, namely, a miniature semiconductor diode, for purposes of simplicity and clarity of explanation only. It will be appreciated that the present invention method is equally applicable to the production of other semiconductor devices employing metallic leads or contacts bonded to the surface of a crystal body. The present invention is particularly advantageous in applications where the leads or contacts are not easily doped by other methods or where the use of other doping methods would drastically change the properties of the contact elements.

Referring now to the drawing there is shown in FIGURE 1 a miniaturized semiconductor diode generally designated by the reference numeral 10. In this embodiment a silicon crystal body forms the heart of the device. The crystal body includes a P type conductivity region 11 and an N type conductivity region 12, separated by a PN junction 13. The PN junction may be produced by any method known to the art, such as by diffusion, for example.

In the illustrative device shown, electrical leads 14 and 15 are ohmically bonded to opposite surfaces of the semiconductor crystal such that the lead 14 is in ohmic contact with N type conductivity region 12 while the other lead 15 is in ohmic contact with the P type conductivity region 11. The leads 14 and 15 are ribbon shaped, i.e., the cross-sectional configuration is rectangular. A favored material for producing such ohmic contact is gold since gold is resistant to etchants typically used in the semiconductor industry. Also, with reference to a silicon semiconductor body, a silicon-gold bond does not melt or degrade at fairly high temperatures, the silicon-gold eutectic temperature being 370° C., a temperature which is yet sufficiently low enough to facilitate the use of mass production techniques. Silver and platinum have occasionally been used as semi-conductor contact materials, yet these elements exhibit a very high eutectic temperature with silicon, and silver has the additional disadvantage that it is not resistant to acids commonly utilized during the fabrication of semiconductor devices.

A protective coating 16 is formed about the crystal body thereby affecting a hermetic seal about the crystal extending a distance outwardly over the lead elements 14 and 15.

In the production of a semiconductor device 10, the initial conductivity of the parent crystal is N type. The P type region 11 is established by diffusion of boron into the parent crystal. One of these regions is removed by lapping to again expose the N type conductivity central region of the parent crystal. Next follows a chemical etch in order to clean the semiconductor surface prior to the lead bonding step.

The lead to be bonded to the N-type region 12 of the crystal is then prepared in accordance with the method of the present invention. Referring now to FIGURE 2, a plurality of these ribbon shaped lead elements can be simultaneously prepared by placing them in random configuration within a vacuum capsule 21 together with a quantity of an active impurity 22. The lead elements are preferably gold plated Kovar ribbons. (Kovar is a trademark identifying the alloy consisting of 29% nickel, 17% cobalt and the balance iron.) Alternatively, gold plated ribbon elements of other suitable metals may be used. A suitable metal is one having a thermal coefficient of expansion on the order of the thermal coefficient of expansion of the semiconductor material and is one which will not melt or otherwise degrade at the temperatures encountered during the fabrication process. Examples of suitable metals for gold plating in order to establish ohmic contact with silicon are other nickel-iron alloys such as Invar, and the 25–50% nickel steels. (Invar is a trademark identifying the alloy consisting of 36% nickel and 64% iron.) Molybdenum, tantalum and tungsten are elemental metals possessing the desired characteristics but their use is restricted by other practical considerations.

The vacuum capsule 21 is then sealed with a suitable stopper 23 through which extends a vacuum line 24 from a vacuum pump 25. An electrical coil heater 26 is connected by electrical leads 27 and 28 to terminals 29 and 31, respectively, the terminals being adapted for connection to a source of alternating current not shown. The coil heater is arranged as shown to heat the central portion of the capsule 21. By consultation of a table of sublimation and vaporization temperatures versus pressures a point may be determined at which the desired specific atmosphere of donor atoms may be obtained. The vacuum capsule 21 is then evacuated by the vacuum pump 25 to a predetermined pressure and the capsule heated by the electrical heater 26 to at least the preselected temperature, and there maintained for a short time to insure creation of a dopant-rich homogeneous atmosphere. The electrical heater is then turned off and the heat withdrawn from the vacuum capsule 21. When the leads 14 have cooled to room temperature the vacuum is released and the leads are withdrawn from the capsule. The vacuum is maintained during cooling to increase the deposition of dopant on the leads 14 and to inhibit oxidation. The cooling time is not critical.

The presently preferred donor active impurity is arsenic, the use of which in the method of the present invention is much less hazardous to human life than its use in the typical prior art processes. A certain minimum quantity of dopant is necessary to establish the desired homogeneous dopant-rich atmosphere within the vacuum capsule 21. The minimum amount of active impurity 22 utilized is dependent upon the size of the vacuum capsule 21, the number of contact elements 14 to be doped, and the subsequent use to which the elements 14 are to be put. Amounts of dopant 22 fairly in excess of the minimum amount will not disturb the desired doping effect because the end portions of the vacuum capsule 21 are at a lower temperature than the central heated portion and any excess dopant will condense on the surfaces of the colder end portions so that only the amount of dopant determined by the pressure and temperature of the heated central portion of the capsule and its contents remains as a homogeneous atmosphere. Upon subsequent cooling of the capsule and its contents, atoms of the dopant present in the atmosphere will deposit on the lead parts 14.

The method of the present invention is suitable for use with dopants that vaporize as well as dopants that sublimate. A sublimating substance is perhaps more desirable for use since, upon cooling, the dopant deposits directly as a solid and not as a liquid. A liquid may give rise to undesirable alloying of the contact material and the dopant, while a solid simply forms a coating on the contact surface, which coating enters beneficially into the bond area during a later stage of semiconductor device fabrication, leaving the rest of the contact metal structurally unchanged.

The selection of a suitable dopant for use in the method of the present invention depends upon the interrelation between temperature and vapor pressure for the dopant. The process temperature is limited by the nature of the contact material. The temperature must be below that which will affect the contact elements, a maximum temperature of about 900° C. being safe for gold or gold-plated contact elements of the illustrative example. Vacuum capsules constructed of Pyrex glass are usable to temperatures of about 500° C., while those constructed of quartz are usable to temperature of about 1,000° C.

It is desirable to perform the method of the present invention under a sufficient vacuum to prevent side reactions with air and oxygen and to obtain better systems kinetics for good circulation of active impurity gas molecules. The maximum pressure at which these desired conditions are achieved is about 100 microns Hg. It is desirable, however, to use even lower pressures since the efficiency of the process is increased by improvements in system kinetics. A vacuum on the order of 1–25 microns Hg is readily obtainable with ordinary vacuum equipment and hence is to be preferred. As stated hereinabove, to facilitate a sufficient vapor density for a fast dopant deposition rate not more than about 1% of the gas molecules in the system should be of residual gases. Hence the vapor pressure of the dopant material, at the selected temperature, should be on the order of at least about 100 times as great as the applied pressure.

In the hereinabove illustrated example of the arsenic doping of gold-plated Kovar leads it was seen that a maximum process temperature of about 900° C. was dictated by the physical properties of gold plated Kovar elements. Since the vapor pressure of arsenic is known to be about 6 mm. Hg at only 500° C. it is seen that the process could be conducted at 500° C. utilizing a vacuum on the order of 60 microns. Selection of a process temperature of 500° C. enables the use of a Pyrex glass vacuum capsule. Accordingly, approximately 5,000 gold plated Kovar leads are randomly disposed, together with one half gram of arsenic, in the central portion of a Pyrex vacuum capsule as shown in FIGURE 2 of the drawing. The dimensions of each electrical lead are 0.0035" x 0.019" x 0.625. The capsule is evacuated to a pressure of 25 microns Hg and then heated to a temperature of 500° C. upon holding the capsule at 500° C. for a few seconds to insure creation of the desired arsenic-rich homogeneous atmosphere, the capsule is cooled and the vacuum released.

It is known that phosphorous also sublimes and has a vapor pressure greater than 1 mm. Hg at 500° C. Hence phosphorous would also be useable as a donor impurity to dope gold or gold-plated leads in a Pyrex vacuum capsule at 500° C. and a vacuum on the order of 10 microns or better. Of the other common donor impurities, bismuth is known to have a vapor pressure of 1 mm. Hg at about 900° C. and antimony a vapor pressure of 1 mm. Hg at about 750° C. Hence these two impurities could be used to dope gold or gold-plated leads in a quartz vacuum capsule at the higher temperatures indicated and at a vacuum on the order of 10 microns or better. In addition, some of the oxides of suitable doping elements possess a sufficient vapor pressure at useable temperatures to enable their use in the method of the present invention.

Of the common P type (acceptor) impurities, such as indium, gallium, boron and aluminum, all have vapor pressures on the order of one micron or less at temperatures below 900° C. and hence would not be practical for doping gold or gold plated elements in accordance with the method of the present invention because of the extremely high vacuum required (less than 0.01 micron Hg pressure), although they might be suitable for doping other elements capable of withstanding the much higher temperatures at which significant vapor pressures are obtained. However, the oxides of these listed acceptor impurities have much higher vapor pressures at lower temperatures and hence should be useable for the doping of gold or gold-plated elements.

The suitability of other dopants may be determined by reference to table of vapor pressure vs. temperature, such as Table 2 beginning on page 746 of the text entitled Vacuum Technique, by S. Dushman, published by John Wiley & Sons in 1949, or to the chart entitled Vapor Pressure Curves for The More Common Elements, by Richard E. Honig and prepared by the Radio Corporation of America.

Thus there has been described a novel technique for economically doping metallic leads with an active impurity for use in establishing ohmic contact to semiconductor crystals. The disclosed technique is suitable for the mass production of semiconductor devices since a large number of leads or contacting elements can be simultaneously doped without the necessity of specific element orientation or line of sight alignment, an even plating action occurring even when the lead elements are placed in random configuration.

Although the present invention has been described with a certain degree of particularity, it is understood that the present disclosure has been made only by way of example and that various changes in the details of construction of the apparatus and the combination and arrangement of steps in the method may be resorted to without departing from the spirit and the scope of the invention as hereinafter claimed.

What is claimed is:

1. The method of depositing a uniform coating of an active impurity upon a gold surface of a metallic electrical contacting element, said method consisting of the steps of:

(a) placing a predetermined active impurity bearing substance and said metallic element into a container, said predetermined active impurity bearing substance having a vapor pressure, at a predetermined temperature not in excess of 900° C., at least one hundred times greater than a predetermined pressure, said predetermined pressure being not in excess of 100 microns Hg;

(b) evacuating said container to said predetermined pressure, and maintaining said predetermined pressure within said container;

(c) heating said active impurity bearing substance and said metallic element within said container to said predetermined temperature to create a homogeneous dopant-rich atmosphere within said container;

(d) cooling said active impurity and said metallic element within said container to cause the deposition of atoms of said active impurity upon the surface of said metallic element; and, (e) releasing the vacuum to return the interior of said container to atmospheric pressure.

2. The method of depositing a uniform coating of an N type active impurity upon a gold surface of a metallic electrical contacting element, said active impurity being selected from a class consisting of arsenic, phosphorous, bismuth and antimony, said method including the steps of:

(a) placing said metallic element and a predetermined active impurity bearing substance into a container;

(b) evacuating said container to a predetermined pressure not in excess of 100 microns Hg and maintaining said predetermined pressure within said container;

(c) heating said metallic element and said active impurity bearing substance within said container to a predetermined temperature at which the vapor pressure of said active impurity bearing substance is at least 100 times greater than said predetermined pressure, said predetermined temperature not being in excess of 900° C., to create a homogeneous dopant-rich atmosphere within said container;

(d) cooling the contents of said container to cause the deposition of atoms of said active impurity upon the surface of said metallic element; and, (e) releasing said vacuum to return the interior of said container to atmospheric pressure.

3. The method of depositing a uniform coating of arsenic upon a gold surface of a metallic electrical contacting element, said method including the steps of:

(a) placing a predetermined arsenic bearing substance and said metallic element into a container;

(b) evacuating said container to a predetermined pressure not in excess of 100 microns Hg and maintaining said pressure within said container;

(c) heating said arsenic bearing substance and said metallic element within said container to a predetermined temperature at which the vapor pressure of said arsenic bearing substance is at least 100 times said predetermined pressure, said predetermined temperature being not in excess of 900° C., to create a homogeneous arsenic-rich atmosphere within said container;

(*d*) cooling the contents of said container to cause a deposition of atoms of arsenic upon the gold surface of said metallic element; and, (*e*) releasing said vacuum to return the interior of said container to atmospheric pressure.

4. The method of depositing a uniform coating of phosphrous upon a gold surface of a metallic electrical contacting element, said method including the steps of:

(*a*) placing a predetermined phosphorous bearing substance and said metallic element into container;

(*b*) evacuating said container to a predetermined pressure not in excess of 100 microns Hg and maintaining said pressure within said container;

(*c*) heating said phosphorous bearing substance and said metallic element within said container to a predetermined temperature at which the vapor pressure of said phosphorous bearing substance is at least 100 times said predetermined pressure, said predetermined temperature not being in excess of 900° C., to create a homogeneous phosphorous-rich atmosphere within said container;

(*d*) cooling the contents of said container to cause a deposition of atoms of phosphorous upon the gold surface of said metallic element; and, (*e*) releasing said vacuum to return the interior of said container to atmospheric pressure.

5. The method of depositing a uniform coating of bismuth upon a gold surface of a metallic electrical contacting element, said method including the steps of:

(*a*) placing a predetermined bismuth bearing substance and said metallic element into a container;

(*b*) evacuating said container to a predetermined pressure not in excess of 100 microns Hg and maintaining said pressure within said container;

(*c*) heating said bismuth bearing substance and said metallic element within said container to a predetermined temperature at which the vapor pressure of said bismuth bearing substance is at least 100 times said predetermined pressure, said predetermined temperature being not in excess of 900° C., to create a homogeneous bismuth-rich atmosphere within said container;

(*d*) cooling the contents of said container to cause a deposition of atoms of bismuth upon the gold surface of said metallic element; and, (*e*) releasing said vacuum to return the interior of said container to atmospheric pressure.

6. The method of depositing a uniform coating of antimony upon a gold surface of a metallic electrical contacting element, said method including the steps of:

(*a*) placing a predetermined antimony bearing substance and said metallic element into an air-tight container;

(*b*) evacuating said container to a predetermined pressure not in excess of 100 microns Hg and maintaining said pressure within said container;

(*c*) heating said antimony bearing substance and said metallic element within said container to a predetermined temperature at which the vapor pressure of said antimony bearing substance is at least 100 times said predetermined pressure, said predetermined temperature being not in excess of 900° C., to create a homogeneous antimony-rich atmosphere within said container;

(*d*) cooling the contents of said container to cause a deposition of atoms of antimony upon the gold surface of said metallic element; and, (*e*) releasing said vacuum to return the interior of said container to atmospheric pressure.

7. The method of simultaneously depositing a uniform coating of arsenic upon a plurality of gold plated electrical leads, said method including the steps of:

(*a*) placing a predetermined quantity of arsenic and said electrical leads into an air-tight container, said electrical leads being disposed in random configuration;

(*b*) evacuating said container to a pressure of about 25 microns Hg and maintaining said pressure within said container;

(*c*) heating said arsenic and said electrical leads within said container to a temperature of about 500° C. to create a homogeneous arsenic-rich atmosphere within said container;

(*d*) cooling said arsenic and said electrical leads within said container to cause a deposition of atoms of arsenic upon the gold plated surfaces of said electrical leads, and (*e*) releasing said vacuum to return the interior of said container to the atmospheric pressure.

References Cited in the file of this patent

UNITED STATES PATENTS

| | | |
|---|---|---|
| 2,695,852 | Sparks | Nov. 30, 1954 |
| 2,873,222 | Derick et al. | Feb. 10, 1959 |
| 2,898,528 | Patalong | Aug. 4, 1959 |
| 2,916,810 | Smith et al. | Dec. 15, 1959 |
| 3,030,562 | Maiden et al. | Apr. 17, 1962 |
| 3,050,667 | Emeis | Aug. 21, 1962 |
| 3,065,534 | Marino | Nov. 27, 1962 |